United States Patent [19]

Nasrallah

[11] Patent Number: 5,530,366
[45] Date of Patent: Jun. 25, 1996

[54] ACOUSTIC OPTICAL SYSTEM FOR PARTIAL DISCHARGE DETECTION AND LOCATION

[75] Inventor: Chaoukat N. Nasrallah, Cary, N.C.

[73] Assignee: ABB Power T&D Company Inc., Raleigh, N.C.

[21] Appl. No.: 332,885

[22] Filed: Nov. 1, 1994

[51] Int. Cl.⁶ ............................. G01R 31/06; G01R 31/12
[52] U.S. Cl. ......................... 324/547; 324/536; 324/552; 324/726
[58] Field of Search .................................... 324/455, 509, 324/512, 536, 547, 551, 552, 553, 726; 367/907

[56] References Cited

U.S. PATENT DOCUMENTS

| 3,173,086 | 3/1965 | Kresge | 324/535 |
|---|---|---|---|
| 3,707,673 | 12/1972 | Carter | 324/547 |
| 3,728,619 | 4/1973 | Harrold et al. | 324/536 |
| 3,801,899 | 4/1974 | Liao | 324/536 |
| 3,882,379 | 5/1975 | Kang | 324/547 |
| 4,095,173 | 6/1978 | Darrel | 324/535 |
| 4,158,168 | 6/1979 | Harrold | 324/535 |
| 4,245,187 | 1/1981 | Wagner et al. | 324/553 |
| 4,654,806 | 3/1987 | Poyser et al. | 364/551 |
| 5,075,629 | 12/1991 | Umemura et al. | 324/547 |
| 5,159,319 | 10/1992 | Dunk et al. | 340/646 |
| 5,253,180 | 10/1993 | Yamagiwa et al. | 324/536 X |
| 5,381,098 | 1/1995 | Loftness | 324/536 |
| 5,386,193 | 1/1995 | Maeda et al. | 324/547 |

FOREIGN PATENT DOCUMENTS 0049984  2/1989  Japan.

OTHER PUBLICATIONS

R. E. James, et al., "Discharge Detection in High–Voltage Power Transformers," Proc. IEEE, vol. 117, No. 7 (Jul. 1970).

*Primary Examiner*—Kenneth A. Wieder
*Assistant Examiner*—Glenn W. Brown
*Attorney, Agent, or Firm*—Woodcock Washburn Kurtz Mackiewicz & Norris

[57] ABSTRACT

An apparatus for detecting a partial discharge in a high voltage transformer comprising a live tank comprises a metal box detachably connected to the tank; a first acoustic sensor inside the box for converting acoustic waves in a first frequency band to a first electrical output signal; signal conditioning circuitry inside the box for amplifying and filtering the first electrical signal; an electrical to optical converter, inside the box, for converting the amplified and filtered electrical signal to an optical signal; a fiber optic link for carrying the optical signal to a location remote from the transformer; and an optical to electrical converter at the remote location for converting the optical signal to a second electrical signal, the second electrical signal being indicative of a partial discharge inside the tank. The second electrical signal may be fed to an oscilloscope or recording equipment for determination of the occurrence of a partial discharge. Multiple boxes can be deployed to form a system for locating the source of the discharge.

14 Claims, 3 Drawing Sheets

ACOUSTIC OPTICAL SYSTEM FOR PARTIAL DISCHARGE DETECTION AND LOCATION

FIELD OF THE INVENTION

The present invention relates to systems for detecting and locating partial discharge or corona in electrical transformers and like apparatus employed in the distribution of electrical energy.

BACKGROUND OF THE INVENTION

A partial discharge or corona has been defined by the American Society for Testing and Materials as "a type of localized discharge resulting from transient gaseous ionization in an insulation system when the voltage stress exceeds a critical value. The ionization is localized over only a portion of the distance between the electrodes of the system." For example, in the specific case of an oil-filled capacitor having polypropylene insulators and oil between parallel electrodes, partial discharge can occur in entrapped or evolved gases that displace the oil. The ionized gases of the corona are highly conductive and would result in a direct arc discharge between electrodes unless prevented from forming a complete path with an insulating barrier.

Partial discharge within the casing of electrical power apparatus, such as liquid filled power transformers and electrical reactors, are difficult to locate because the small energy content of most sources leaves no observable evidence on the surrounding insulating structure. However, while low, the energy content of partial discharges may cause a progressive deterioration of the surrounding insulation, which may lead to eventual failure of the apparatus. Therefore, it is important to detect and locate any sources of corona or partial discharge during testing of the apparatus.

Because of the difficulty in detecting and locating corona sources, many different arrangements and methods have been proposed. The usual methods fall into one of two classes, which are broadly designated electrical methods and sonic methods. Both approaches are useful, as one may be more successful in detecting and locating a certain type or location of corona source (partial discharge) than the other. For example, the electrical tests are not effective if the corona source is not in the electrical winding being monitored. Since the energy content of a corona discharge is small, sensitivity of the detecting apparatus is a problem with both general approaches, but it is more of a problem with the sonic methods. For example, the sonic methods for detecting and locating corona would be more useful if they were more sensitive, as the relatively low velocity of sound waves propagating through liquid transformer dielectric makes it attractive to locate corona sources by measuring the time for the sound wave to reach different points in the transformer, to convert this time to distance, and then to calculate the coordinates of the source. However, the accuracy of the sonic approach depends upon being able to detect the disturbances responsive to the corona discharges, and to separate the resulting signals from background noise.

One example of a prior art approach is disclosed by U.S. Pat. No. 3,801,899, Apr. 2, 1974, titled "Means for Detecting the Inception of Corona Discharges Within Induction Apparatus." The system disclosed by this patent is depicted in part by FIG. 1 attached hereto. The system is attached to an induction apparatus schematically shown as a single phase power transformer 10 comprising a high voltage winding 12, a low voltage winding 14, and an iron core 16. The transformer also comprises a grounded metal tank 18 in which the windings 12 and 14 are located, and an oil dielectric 20 within the tank. Each of the windings 12, 14 has its lower terminal connected to ground.

A high voltage terminal bushing 22 is provided for carrying current between an external phase conductor 21 and the high voltage winding 12. This terminal bushing comprises a high voltage conductor 24 and a porcelain shell 26 that supports the bushing conductor and electrically isolates it from the grounded tank 18. The bushing also includes an insulating core 28 located within the porcelain shell and surrounding the conductor 24 and oil filling the space between the core 28 and the shell 26. Between the outer shield 32 and a tubular ground sleeve 34 are two spaced-apart leads 36 and 38 connected to provide a voltage between the leads proportional to the much greater voltage between the high voltage conductor 24 and ground.

A corona-level detector and a high pass filter sense corona discharges on the high voltage power circuit phase that includes the conductors 21, 24, and the winding 12. To assist the corona detector in distinguishing between corona discharges occurring inside the induction apparatus 10 and those occurring outside the induction apparatus, the corona-level detector is enabled only during a portion of each cycle of voltage. The reason for disabling the corona-level detector is that corona in air will produce strong high-frequency components on positive crests but only weak ones on negative crests. Thus, the corona-level detector will remain off in most cases where only corona in air is present.

It is known that corona discharges produce both audible and ultrasonic pressure waves in the medium surrounding the discharge. These pressure waves generally contain a wide range of frequency components. In gases, the high frequencies are attenuated, leaving only vibrations in the audible sound range. In liquids and in some solids, the attenuation of high frequencies is not as severe, and the corona discharges will produce pressure variations rich in ultrasonic components as well as audible components. For detecting the presence of such ultrasonic components, a transducer 40 is located within the dielectric liquid 20 adjacent the grounded wall of tank 18. This transducer produces an output voltage proportional to the amplitude of the pressure wave. This output is amplified and fed to the ultrasonic pressure-wave level detector, which produces an output signal pulse if the amplitude of the signal exceeds a predetermined level. This output signal continues until the level detector is disabled at the end of a pressure-wave sampling period. The signal pulses from the two level detectors (corona level detector and ultrasonic pressure-wave level detector) are supplied to a coincidence circuit. The coincidence circuit develops an output signal if the two input signals are received during a preselected sampling period. This arrangement purportedly distinguishes between cases where radio-frequency components are being produced by corona occurring within the liquid 20 and cases where corona external to the induction apparatus 10 produces radio frequency components on negative as well as positive loops of voltage.

Another example of a prior art approach is disclosed by U.S. Pat. No. 3,707,673, Dec. 26, 1972, titled "Corona Discharge Detecting Apparatus Including Gatable Amplifiers Controlled By Flip-Flop Means." Briefly, this patent discloses apparatus for accurately detecting corona discharges occurring within the casing of transformers and electrical reactors. Mechanical disturbances within the apparatus, initiated by corona discharges, are detected by two spaced mechanical-to-electrical transducers. The signals from the two transducers are amplified and converted to unidirectional signals of like polarity. The two signals are then subtracted to cancel noise common to both signals.

The above-cited disclosures and other prior art approaches of which the present inventor is aware employ acoustic or mechanical sensors mounted on the grounded tank walls of the transformer (or other high voltage apparatus), or electrical sensors mounted on the high voltage bushings of the transformer. These approaches are useful in detecting high level discharges. However, they are not particularly useful in substations or like environments where there is a high level of outside interference. For example, such high level interference is present during impulse testing, which involves charging and discharging high voltage capacitors in the vicinity of a transformer to test the transformer's reliability in an environment with lightning. Moreover, the prior art lacks a system for detecting partial discharges through a live (high potential) tank wall. Thus, for example, in applications involving an inverted current transformer or live tank breaker, the known prior art systems cannot be used to detect partial discharge.

Another shortcoming of the prior art is that systems for locating the source of a partial discharge are unreliable. For example, systems that use triangulation and multiple acoustic sensors distributed outside the transformer tank are available, but they are susceptible to external noise and do not work well when there are multiple noise discharge sources.

SUMMARY OF THE INVENTION

The present inventor has discovered that the shortcomings of the prior art can be overcome by mounting acoustic sensing devices directly on live (high potential) components (e.g., a high voltage bushing or tank) of the apparatus being monitored, which may include power, potential, and current transformers of the oil field, dry, or cast coil type. Multiple detection devices can be deployed to form a simple and reliable system for locating the source of a partial discharge (e.g., by triangulation). The present invention can be used in a system for detecting and locating partial discharges within a live tank by attaching the detection means to the live tank. The use of a box for holding a first acoustic sensor, signal conditioning circuitry, and electrical to optical converter provides shielding against interference associated with impulse testing or other high noise apparatus (e.g., devices that emit white noise or electrical discharges in air) in the vicinity. An optical link provides isolation between the high voltage tank and an oscilloscope or other recording instrument at a remote location. The optical link also provides noise immunity as the optical signal is carried to the remote location.

According to the present invention, a system for detecting a partial discharge in a high voltage transformer comprising a live or high potential tank comprises a metal box detachably connected to the tank; a first acoustic sensor inside the box for converting acoustic waves in a first frequency band to a first electrical output signal; signal conditioning circuitry inside the box for amplifying and filtering the first electrical signal; an electrical to optical converter, inside the box, for converting the amplified and filtered electrical signal to an optical signal; a fiber optic link for carrying the optical signal to a location remote from the transformer; and an optical to electrical converter at the remote location for converting the optical signal to a second electrical signal, the second electrical signal being indicative of a partial discharge inside the tank. The second electrical signal may be fed to an oscilloscope or recording equipment for determination of the occurrence of a partial discharge. In addition, multiple systems of the type disclosed herein may be configured to determine the location of the partial discharge, e.g., by calculating the location on the basis of time differences between the respective waveforms output by the systems.

In one preferred embodiment of the invention, the box comprises a bottom wall and at least one magnetic member attached to the bottom wall and magnetically attaching the box to the tank. Moreover, this preferred embodiment further comprises a second acoustic sensor outside the box, wherein the second acoustic sensor converts acoustic waves in a second frequency band to a third electrical signal. In addition, the preferred embodiment further comprises a power supply inside the box for supplying power to the signal conditioning circuitry and the electrical to optical converter.

As mentioned, multiple detection devices can be used to locate the source of a partial discharge. In one preferred embodiment, the correlation between an electrical signal from a bushing tap and a signal from an optically isolated acoustic sensor mounted on the stud of a bushing can be used to locate the source or sources of the partial discharge. An analysis can be performed to determine whether the source(s) is (are) within the transformer winding or external to the winding.

Other features of the present invention are described below.

DETAILED DESCRIPTION OF PREFERRED EMBODIMENTS

Figure 1:
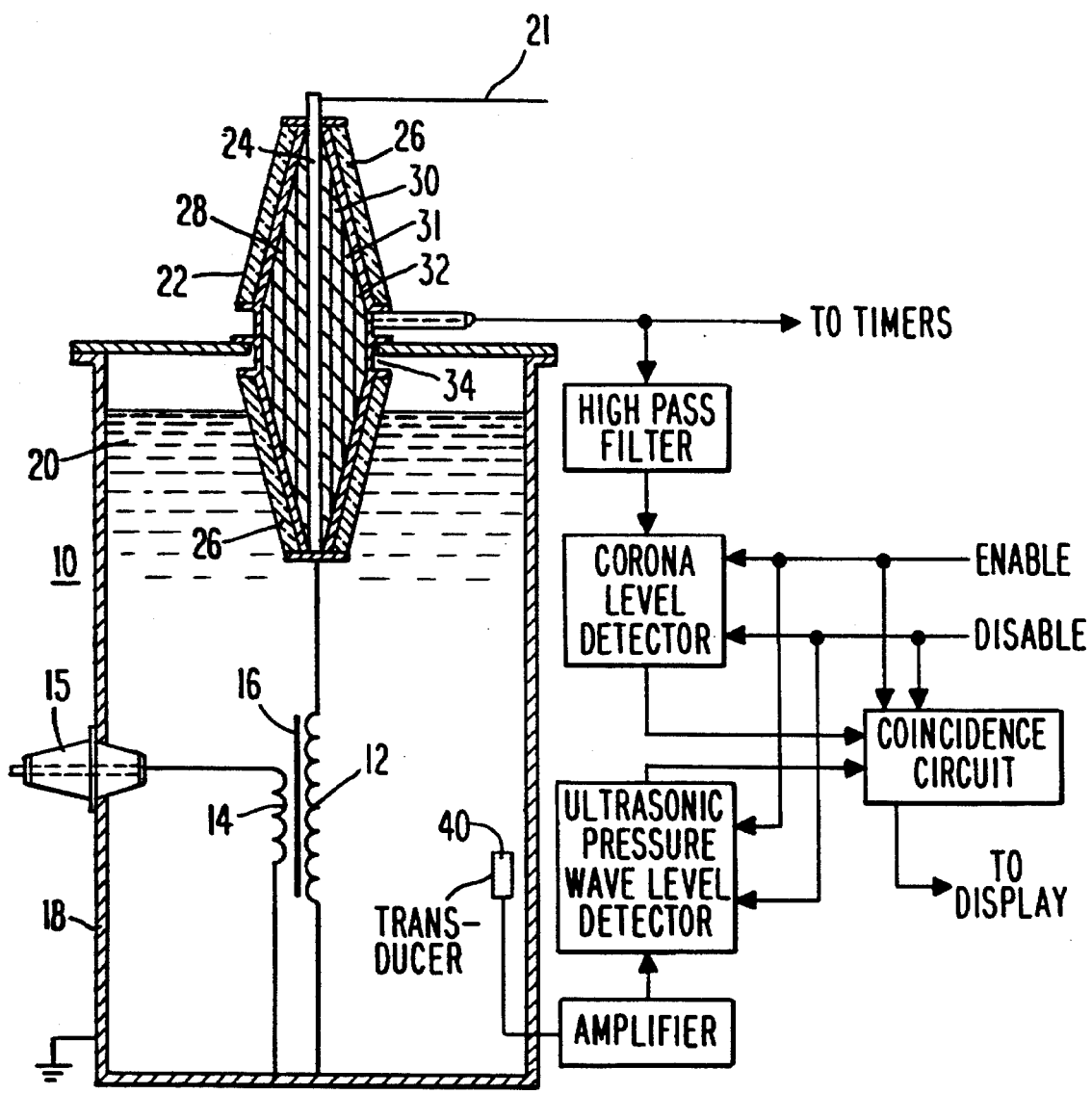
FIG. 1 schematically depicts a prior art corona detecting system.
Figure 2:
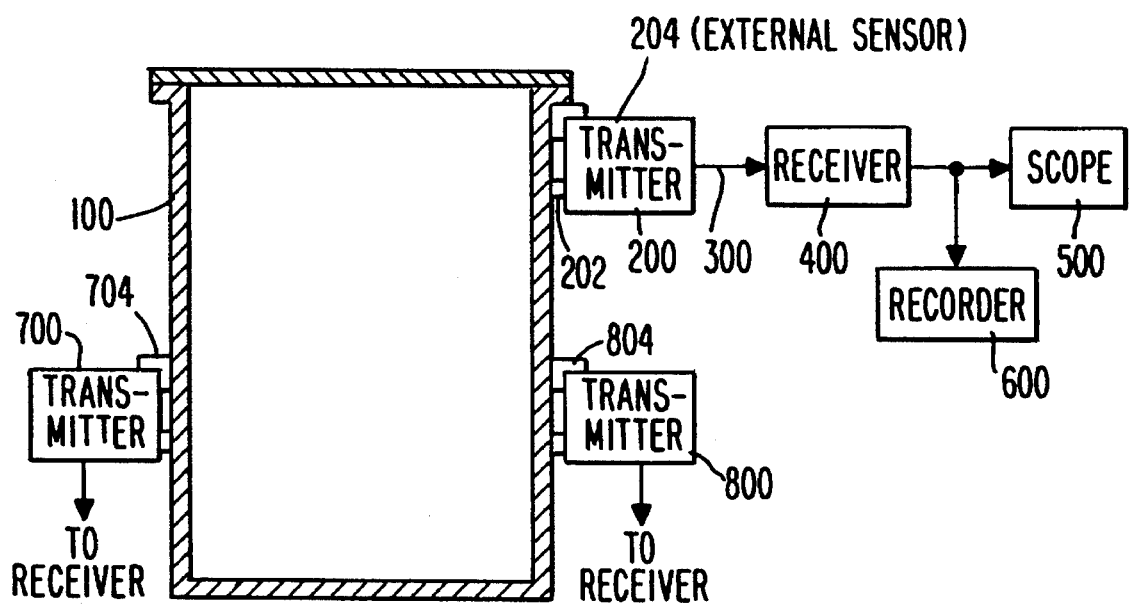
FIG. 2 schematically depicts a partial discharge detection and location system in accordance with the present invention.

FIG. 2 schematically depicts a system for detecting and locating a partial discharge or impulse failure inside a high voltage transformer 100. The system comprises a transmitter 200 attached to a wall of the transformer 100 by magnets 202 attached to the transmitter. In addition, an external acoustic sensor 204 is attached to an external wall of the transmitter 200. The external sensor 204 is in contact with the tank wall so that it can detect high frequency acoustic energy generated inside the tank. The transmitter is coupled via a fiber optic link 300 to a receiver 400. The receiver 400 is coupled to an oscilloscope 500 and a recorder 600. The transmitter 200 further includes an internal acoustic sensor 210 (shown in FIG. 3). The external acoustic sensor 204 is optional and may not be included in certain embodiments of the invention. The internal acoustic sensor converts acoustical waves in a first frequency range, for example, 40 to 400 kHz, to an electrical signal. The transmitter 200 converts the electrical signal to an optical signal and sends the optical signal via the optical link 300 to the receiver 400. The receiver converts the optical signal to an electrical signal, which is fed to the scope 500 and/or the recorder 600. The signal from the receiver is converted to and displayed as a waveform by the scope or recorder and may be used to detect the occurrence of a partial discharge within the transformer 100. The manner is which a waveform is used to detect the occurrence of a discharge is well known in the art.

In addition, in applications of the invention requiring the determination of the location of a partial discharge within the transformer, additional transmitters 700, 800 are employed. These transmitters are identical to the transmitter 200 and provide waveforms to the scope and/or recording instruments. The respective waveforms may be used to determine the coordinates of the partial discharge by triangulation, which involves calculating the time differences of arrival of the respective waveforms. Again, triangulation is well known.

Figure 3:
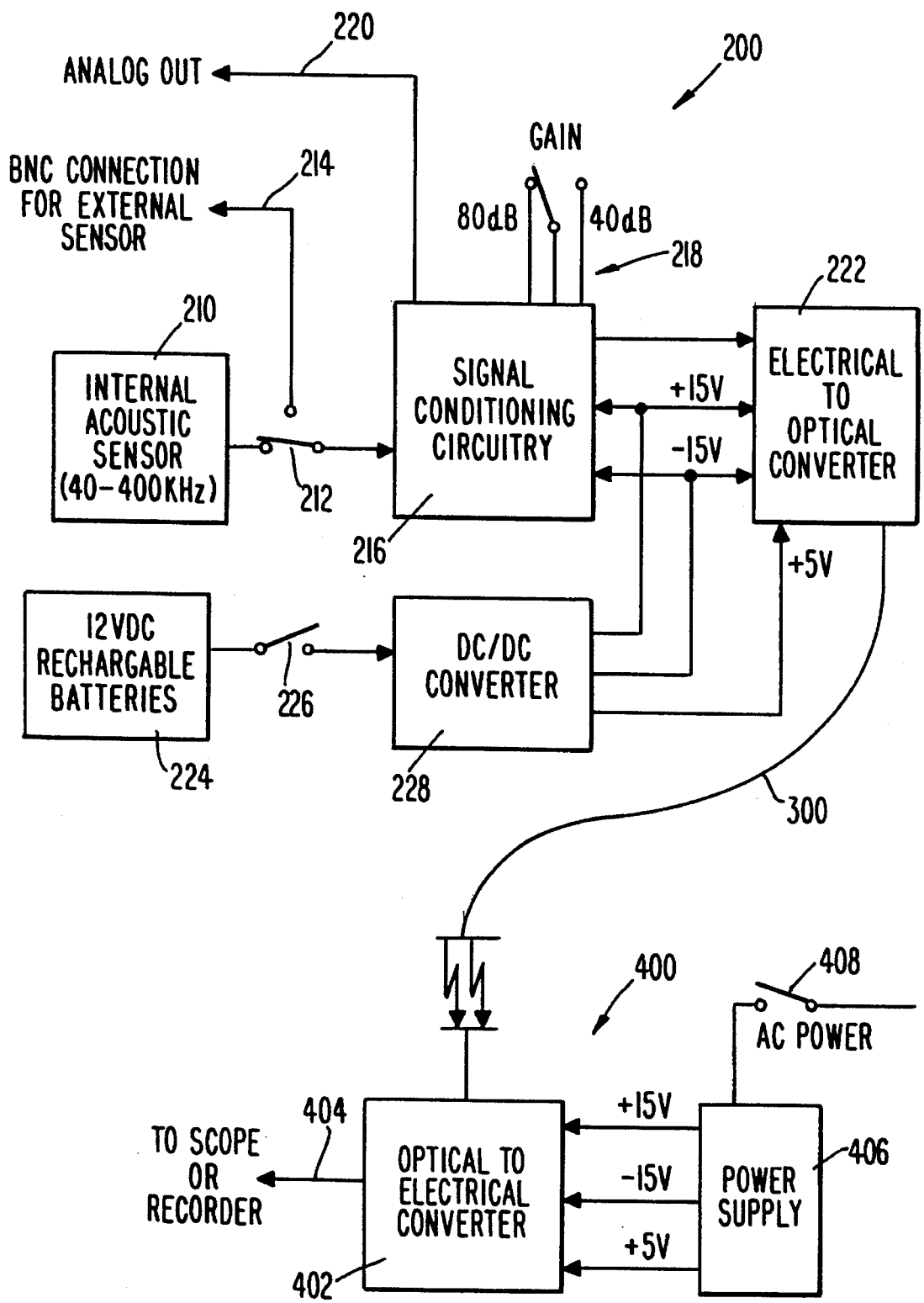
FIG. 3 schematically depicts the circuity inside the transmitter block.

FIG. 3 schematically depicts the components inside the transmitter 200 and receiver 400. The transmitter 200 includes the internal acoustic sensor 210, and switch 212, a BNC connection 214 for the external sensor 204 (shown in FIG. 2), signal conditioning circuitry 216, a gain control switch 218, an optional analog output 220, an electrical to optical converter 222, a 12 volt DC battery supply 224, a power switch 226, and a DC to DC converter 228. The optional analog output 220 may be used for partial discharge detection in applications wherein the transmitter 200 is attached to a "dead" transformer case (i.e., a transformer case which is grounded). In such applications, it is not necessary to provide isolation between the transmitter and the receiver and, therefore, the electrical to optical conversion is not necessary. In addition, it should be noted that the operational frequency range of the external acoustical sensor is preferably different from that of the internal acoustic sensor. For example, where the internal acoustic sensor senses acoustic waves in the 40 to 400 kHz band, the external acoustic sensor may be used to sense acoustic waves in the 700 kHz to 1.2 MHz band.

The receiver 400 includes an optical to electrical converter 402, an output 404 providing the output signal from the optical to electrical converter to the oscilloscope 500 and/or recorder 600 (shown in FIG. 2), a power supply 406 providing DC power to the optical to electrical converter, and an AC power switch 408.

Figure 4:
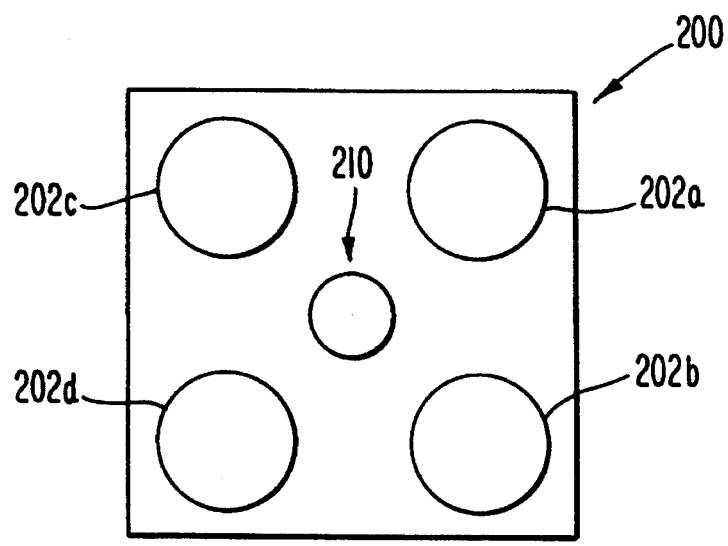
FIG. 4 depicts a bottom view of the box containing the transmitter, showing the location of magnets for attaching the box to a transformer.

FIG. 4 depicts the bottom of the casing or box (which is preferably a metal (aluminum) box) of the transmitter 200. As shown, attached to the bottom of the box is a plurality of magnets 202a, 202b, 202c, 202d for holding the box to the external wall of the transformer. This allows the transmitter box to be easily attached to and detached from the transformer. In addition, the location of the internal sensor 210 in the center of the box is shown.

In a preferred embodiment of a system for localizing partial discharges inside a transformer, an acoustical signal propagating through a winding to a bushing stud is detected by a transmitter 200 of the type described above. The transmitter is preferably mounted directly on the bushing stud to eliminate damping of the acoustic signal by mechanical connections. This acoustic signal is correlated with an electric signal simultaneously detected (by known means, such as a voltage or current meter, or the like) at a bushing tap.

It is known that an electric signal travels in a conductor at a speed of approximately 200 million meters/second, whereas an acoustic signal propagates at a speed of approximately 3000–5000 meters/second. The location(s) of the source(s) of partial discharge is determined by capturing and analyzing the simultaneously-measured electric and acoustic signals. The measured time delay between the arrival of the electric and acoustic signals is employed to calculate the location of each source. The impedance of the winding can be used to accurately determine the propagation speeds of the signals. Reflections of the signals in the winding are preferably nulled out.

In addition, the characteristics of the acoustic energy and repetition rate of the electrical discharge can be used to identify the type of discharge. For example, sources can exist at two general locations inside an oil filled transformer—in a winding and in the transformer tank. This invention can distinguish these source locations. Discharges in the windings are transmitted through the copper conductor and detected acoustically and electrically, whereas discharges within the transformer tank (e.g., in voids in solids, liquids, or floating particles) are not detected by the acoustic sensor but are detected electrically.

The present invention can be used in the field to distinguish discharges occurring inside the transformer and discharges from external transmission lines. The direction of discharges can also be detected by the acoustic sensor.

The acoustic sensor can be employed as part of a standard test procedure in factories and in permanent installations in the field.

Electromagnetic interference during impulse testing is unavoidable due to the electromagnetic pulse generated when discharging the charged/stored energy of generator capacitors to the testing device (transformers). Electronics and measurement equipment must have specially designed circuits to reject such interference. Standard measurement and control systems used for recording of impulses are properly shielded and protected against overvoltage. Faraday cages are used in electronics measurements systems to protect and shield from the electromagnetic interference.

Measurement systems are subject to two types of electromagnetic interference:

1. direct influence from coupling; and,
2. coupling through the grounding system.

The first direct influence is coupled through air and this type of interference is corrected by proper shielding of the instrument. Coupling through grounding and the cable shields of the measurement and control system is fixed by proper galvanic isolation.

The invented system has immunity to electromagnetic interference by the nature of the design. The Fiber Optic Link between the transmitter (TX) and receiver (RX) is immune to electromagnetic influence. Since there is no ground and shield connection between the TX and RX, the electromagnetic pulse cannot propagate. The box housing the acoustic sensor, signal conditioner, and the analog to optic converter provides the Faraday shielding for TX.

The advantages of this invention are the following:

immune to electromagnetic pulse during impulse testing.

can detect a failure during impulse testing. Usually impulse failures can only be detected by the mean measuring electrical signal through a voltage divider.

the major advantage of the invention is the localization of failure during impulse testing by using two or more TX.

can detect partial discharge inside the transformer in a noisy environment.

Finally, it should be noted that, except where they are expressly so limited, the scope of protection of the following claims is not intended to be limited by the details of the preferred embodiments described herein.

I claim:

1. A system for detecting a partial discharge in a high voltage transformer comprising a live or ungrounded tank, comprising:

(a) a metal box detachably connected to said tank;

(b) a first acoustic sensor inside said box for converting acoustic waves in a first frequency band to a first electrical output signal;

(c) signal conditioning circuitry inside said box and coupled to said first acoustic sensor, said signal conditioning circuitry amplifying and filtering said first electrical signal;

(d) an electrical to optical converter, inside said box and coupled to said signal conditioning circuitry, for converting the amplified and filtered electrical signal from said signal conditioning circuitry to an optical signal;

(e) a fiber optic link for carrying said optical signal to a location remote from said transformer; and (f) an optical to electrical converter, coupled at the remote location to said fiber optic link, for converting said optical signal to a second electrical signal, said second electrical signal being indicative of an occurrence of a partial discharge inside said tank.

2. A system as recited in claim 1, wherein said box comprises a bottom wall and at least one magnetic member attached to said bottom wall and magnetically attaching said box to said tank.

3. A system as recited in claim 1, further comprising a second acoustic sensor outside said box and operatively coupled to said signal conditioning circuitry, wherein said second acoustic sensor converts acoustic waves in a second frequency band to a third electrical signal.

4. A system as recited in claim 1, further comprising a power supply inside said box for supplying power to said signal conditioning circuitry and said electrical to optical converter.

5. A system as recited in claim 1, wherein said box comprises a bottom wall and at least one magnetic member attached to said bottom wall and magnetically attaching said box to said tank; and further comprising: a second acoustic sensor outside said box and operatively coupled to said signal conditioning circuitry, wherein said second acoustic sensor converts acoustic waves in a second frequency band to a third electrical signal; and a power supply inside said box for supplying power to said signal conditioning circuitry and said electrical to optical converter.

6. A system as recited in claim 5, further comprising means for detecting an electric signal propagating in a conductor, and means for correlating said electric signal with a simultaneously detected acoustic signal, whereby the location of the source of a discharge can be determined.

7. A system as recited in claim 1, further comprising means for detecting an electric signal propagating in a conductor, and means for correlating said electric signal with a simultaneously detected acoustic signal, whereby the location of the source of a discharge can be determined.

8. A method for detecting a partial discharge in a high voltage transformer comprising a live or ungrounded tank, said partial discharge causing acoustic waves to emanate from said tank, comprising the steps of:

(a) attaching a metal box to an external surface of said tank;

(b) inside said box, sensing acoustic waves in a first frequency band and converting the sensed acoustic waves to a first electrical output signal;

(c) inside said box, amplifying and filtering said first electrical output signal;

(d) inside said box, converting the amplified and filtered first electrical signal to an optical signal;

(e) transmitting said optical signal to a location remote from said transformer; and (f) at said remote location, converting said optical signal to a second electrical signal indicative of an occurrence of said partial discharge inside said tank.

9. A method as recited in claim 8, wherein said box is magnetically attached to said tank.

10. A method as recited in claim 8, further comprising sensing acoustic waves in a second frequency band outside said box and converting said acoustic waves in the second frequency band to a third electrical signal, and employing said third electrical signal as an indication of the acoustic energy in said second frequency band.

11. A method as recited in claim 8, further comprising detecting an electric signal propagating in a conductor and simultaneously detecting an acoustic signal, and determining the location of the source of the discharge on the basis of the detected signals.

12. A method for detecting a partial discharge in a high voltage transformer comprising a live or ungrounded tank, said partial discharge causing acoustic waves to emanate from said tank, comprising the steps of:

(a) attaching a metal box to an external surface of said tank;

(b) inside said box, sensing acoustic waves in a first frequency band and converting the sensed acoustic waves to a first electrical output signal;

(c) inside said box, converting the first electrical signal to an optical signal;

(d) transmitting said optical signal to a location remote from said transformer;

(e) at said remote location, converting said optical signal to a second electrical signal indicative of an occurrence of said partial discharge inside said tank; and (f) sensing acoustic waves in a second frequency band outside said box and converting said acoustic waves in the second frequency band to a third electrical signal, and employing said third electrical signal as an indication of the acoustic energy in said second frequency band.

13. A method as recited in claim 12, further comprising detecting an electric signal propagating in a conductor and simultaneously detecting an acoustic signal, and determining the location of the source of the discharge on the basis of the detected signals.

14. A method as recited in claim 12, further comprising detecting an electric signal propagating in a conductor and simultaneously detecting an acoustic signal, and determining the location of the source of the discharge on the basis of the detected signals.

* * * * *